United States Patent [19]

Meek et al.

[11] Patent Number: 4,784,686

[45] Date of Patent: Nov. 15, 1988

[54] SYNTHESIS OF ULTRAFINE POWDERS BY MICROWAVE HEATING

[75] Inventors: Thomas T. Meek, Knoxville, Tenn.; Haskell Sheinberg, Los Alamos; Rodger D. Blake, Santa Fe, both of N. Mex.

[73] Assignee: The United States of America as represented by the United States Department of Energy, Washington, D.C.

[21] Appl. No.: 41,950

[22] Filed: Apr. 24, 1987

[51] Int. Cl.$^4$ .................. B22F 9/18; C22C 19/03; C22C 29/12; F26B 3/337

[52] U.S. Cl. .................. 75/0.5 AC; 34/4; 75/0.5 BC; 159/DIG. 26; 204/157.43; 252/518; 252/521; 501/123; 505/1

[58] Field of Search .............. 34/4; 99/DIG. 14; 159/DIG. 26; 204/157.43; 252/518, 521; 501/123; 75/0.5 AC, 0.5 BC

[56] References Cited

U.S. PATENT DOCUMENTS

| | | | |
|---|---|---|---|
| 3,415,640 | 12/1968 | Lambert | 75/0.5 AC |
| 3,625,673 | 12/1971 | Lindquist | 75/0.5 AC |
| 4,181,743 | 1/1980 | Brumlick | 426/241 |
| 4,364,859 | 12/1982 | Ohtsuka | 252/643 |
| 4,549,053 | 10/1985 | Haugh | 219/10.55 M |
| 4,556,416 | 12/1985 | Kamijo et al. | 75/0.5 B |

OTHER PUBLICATIONS

Engler, E. M. et al., "Superconductivity ... of a Family of Perouskite-Based Superconductors", *J. Am. Chem. Soc., 109, 2848-2849, Apr. 29, 1987.*

Hor, P. H., et al., "High Pressure Study of the New Y-Ba-Cu-O Superconducting Compound System", *Phy. Rev. Lett.,* V. 59, No. 9, pp. 911-912, Mar. 2, 1987.

L. M. Sheppard, "Low-Temperature Synthesis of Ceramics," Adv. Mater. & Processes, Inc. Metal Prog., 47 (Nov. 1986).

*Primary Examiner*—Dennis Albrecht
*Attorney, Agent, or Firm*—David K. Cornwell; Richard J. Cordovano; Judson R. Hightower

[57] ABSTRACT

A method of synthesizing ultrafine powders using microwaves is described. A water soluble material is dissolved in water and the resulting aqueous solution is exposed to microwaves until the water has been removed. The resulting material is an ultrafine powder. This method can be used to make $Al_2O_3$, $NiO+Al_2O_3$ and NiO as well as a number of other materials including $GaBa_2Cu_3O_x$.

5 Claims, No Drawings

SYNTHESIS OF ULTRAFINE POWDERS BY MICROWAVE HEATING

BACKGROUND OF THE INVENTION

This invention relates generally to ultrafine powders and, more specifically, to a method for synthesizing ultrafine powders using microwaves. This invention is the result of a contract with the Department of Energy (Contract No. W-7405-ENG-36).

Recently many methods for manufacturing fine metal powders have been proposed. Efforts to develop these methods by industry are a result of the need for materials which are easily sintered and which yield products with improved mechanical properties.

U.S. Pat. No. 4,556,416 describes one process for manufacturing a powder. To use this process a reaction chamber is first exhausted to about $10^{-4}$ torr. A volatile metal compound gas or an evaporated metal or both and a reaction gas are mixed and supplied to the reaction chamber. The gas is then ionized by means of a high frequency induction coil. Simultaneously, the gas is irradiated by a laser. The reaction product and exhaust gas are discharged through an exhaust port and powder is collected by a filter.

This type of system has the disadvantage of having high energy consumption and high capital equipment costs because of the need for evacuation equipment, induction coils, and a laser. The invention also has the disadvantage of requiring a carrier gas such as nitrogen or hydrogen.

Conventional radio-frequency (rf) plasma tubes are used to produce fine powders but consume a lot of energy because the plasma is maintained at a temperature of about 10,000 K. Usually the starting material is in the form of an aerosol or liquid which is introduced into a gaseous plasma. Fine powders are then collected at the bottom of the rf plasma column. Large quantities of powders cannot be produced using conventional plasma tubes.

Another method of producing ultrafine powders is a mechanical technique whereby powders are ground by a vibration ball mill in a methanol medium. Using this technique 0.1 μm diameter particles are manufactured only after 120 hours of grinding.

There are still other methods of making powders including evaporative decomposition of solids, hydrothermal processing, rapid expansion of supercritical fluids, and reductive dehalogenation of elemental halides. These methods and the disadvantages of each are discussed in L. M. Sheppard, "Low-Temperature Synthesis Of Ceramics," Adv. Mater. & Processes, Inc. Metal Prog., 47 (November 1986).

It is therefore an object of the invention to produce fine powders in a system which minimizes energy consumption.

It is another object of the invention to produce fine powders quickly and without the need of expensive capital equipment.

SUMMARY OF THE INVENTION

To achieve the foregoing and other objects, and in accordance with the purposes of the present invention, as embodied and broadly described herein, the method for synthesizing powders includes the steps of dissolving a water soluble material into water and exposing the resulting aqueous solution to microwave radiation at a frequency and power effective to remove the aqueous solution and yielding a fine powder.

DETAILED DESCRIPTION OF THE PREFERRED EMBODIMENTS

Ultrafine powders are valuable because the driving force for sintering (densification) is a reduction of surface free energy. The more surface free energy, i.e., the smaller the powder size, the greater the driving force for densification. In general, the mechanical properties of the resulting sintered material are inversely related to the particle size or grain size. In other words, materials made by sintering ultrafine powders have superior mechanical properties.

By dissolving a nitrate, sulfate, chlorate, or other water soluble material in water, powders can be synthesized simply by exposing the aqueous solution to microwave radiation. A powder is produced which, depending on processing parameters, can be an ultrafine powder. While the definition of "ultrafine powder" is not universally fixed, powders with particle sizes less than 0.1 μm can be achieved using the method of the present invention.

Some products that result from the practice of the invention and their corresponding starting system are shown in the Table. Also shown in the Table are the available BET surface area results using the invention. Naturally, the systems listed in the Table are only illustrative. It is anticipated that other systems, e.g., carbides, borides, can be used to practice the invention.

It is believed that the particle size of the powders produced using the invention can be controlled by varying one or more of the following parameters:

TABLE

| SYSTEM | PRODUCT | BET SURFACE AREA ($m^2/g$) |
| --- | --- | --- |
| Aluminum Nitrate | $Al_2O_3$ | .2 |
| Aluminum Nitrate + Zirconium Nitrate | $Al_2O_3 + ZrO_2$ | 16.3 |
| Aluminum Sulfate | $Al_2O_3$ | 5.3 |
| Lead Nitrate + Aluminum Nitrate | $Al_2O_3 + Pb_2O_3$ | |
| Silver Nitrate + Aluminum Nitrate | $Ag + Al_2O_3$ | |
| Nickel Nitrate + Aluminum Nitrate | $NiO + Al_2O_3$ | 42.0 |
| Ferric Nitrate + Manganese Nitrate | $Fe_2O_3 + MnO$ | |
| Cupric Sulfate | $CuO$ | |
| Potassium Chlorate + Aluminum Nitrate | $Al_2O_3 + K_2O$ | |
| Aluminum Sulfate + Ferric Nitrate | $Al_2O_3 + Fe_2O_3$ | |
| Zinc Nitrate | $ZnO$ | |
| Ferric Nitrate | $Fe_2O_3$ | |
| Nickel Nitrate | $NiO$ | 29.8 |
| Nickel Nitrate + Aluminum Nitrate | $Al_2O_3 + NiO$ | 17.9 |

1. rate of heating the aqueous solution:
2. concentration of the soluble material in the water;
3. temperature and time at temperature of the solution; and
4. volume of the furnace (geometry of the container used).

Recent reports of materials having superconductivity at temperatures as high as about 95 K. have generated interest in methods of making these materials in a form which make them useful. Zachary Fisk and his colleagues at Los Alamos National Laboratory have reported rare earth-barium-copper-oxides in which superconductivity occurs below about $T_c=95$ K. It is believed that the present invention is a simple and effective method for making $REBa_2Cu_3O_x$, where RE = Sm, Eu, Gd, Tb, Dy, and Ho.

The best information that the inventors have received show that $GdBa_2Cu_3O_x$ is superconducting below about $T_c=93$ K., and $EuBa_2Cu_3O_x$ below about 95 K. The other $REBa_2Cu_3O_x$ materials are also superconducting at relatively high temperatures.

To make these materials $Ba(NO_3)_2$, $Cu(NO_3)_2$ along with a rare earth containing material such as $Gd(NO_3)_3$ are dissolved in water and exposed to microwaves until the water is consumed. The resulting powder is reheated in an oxygen atmosphere in a conventional tube furnace to drive oxygen into the system.

EXAMPLE 1

Ultrafine powders were produced by dissolving 100 g of nickel nitrate and 1.5 g of aluminum nitrate in 80 ml of water and heating the solution in a microwave oven at a frequency of 2.45 GHz and 700 W of power for approximately 35 minutes (until the water is consumed). It should be noted that microwaves minimize the risk of having nitrates explode. If a conventional oven is used the risk of explosion when making powders from a nitrate material is high.

Using these conditions, the BET surface area of four samples ranged from 3.53 $m^2/g$ to 3.89 $m^2/g$. Varying the volume of the container used to contain the aqueous solution did not appear to appreciably change the surface area of the end materials for this material.

When the volume of water increased from 80 ml to 320 ml and the time of heating was increased from 35 minutes to 55 minutes, the BET surface area increased to 5.158 $m^2/g$.

It is believed that at higher microwave frequencies or at higher powers such as 6 kW, the process for making powders could be accomplished in 1-10 minutes.

EXAMPLE 2

Twenty grams of Zirconium Nitrate ($Zr(NO_3)_4 \cdot 5H_2O$) and 20 g of Aluminum Nitrate ($Al(NO_3)_3 \cdot 9H_2O$) were dissolved in 80 $cm^3$ of water. The solution was heated for 60 minutes in a microwave oven having a microwave frequency of 2.45 GHz and a power of 700 W. The resulting powder had a BET surface area of 16.3 $m^2/g$.

EXAMPLE 3

One hundred grams of Nickel Nitrate ($Ni(NO_3)_2 \cdot 6H_2O$ and 16 g of Aluminum Nitrate ($Al(NO_3)_3 \cdot 9H_2O$) were dissolved in 80 $cm^3$ of water. The solution was heated for 55 minutes in a microwave oven. The frequency of the microwaves was 2.45 GHz and the power used was 700 W. The resulting $NiO-Al_2O_3$ powder had a BET surface area of 42.0 $m^2/g$.

EXAMPLE 4

For some applications it may be desirable to make a $Ni-Al_2O_3$ fine powder composite. This is accomplished by taking the product resulting from Example 3 and heating the $NiO-Al_2O_3$ powder in a conventional tube furnace in a hydrogen atmosphere at a temperature of 600° C. for two hours. The $Al_2O_3$ is unchanged by this reheating, however, the NiO is reduced to nickel metal (Ni). Analysis of the product showed that a $Ni-Al_2O_3$ composite was produced having a BET surface area of approximately 21.1 $m^2/g$.

Therefore the process of the invention with subsequent hydrogen treatment can produce a metal-oxide composite with any metal which reduces from its oxide to a metal with hydrogen. Fine nickel metal powder was produced by heating nickel nitrate solution with microwaves and reducing the product powder in hydrogen. It is believed that finely divided metal alloy powders can be reduced in this manner without the need to melt the material.

Because the $Al_2O_3$ does not reduce, the product after hydrogen sintering yields an oxide dispersion strengthened metal. In addition, the resulting powder has a narrow particle size distribution. For this example the median particle had a diameter of 773 nm. Ninety percent of the particles had diameters less than 1492 nm and ten percent had diameters less than 401 nm.

EXAMPLE 5

$GdBa_2Cu_3O_x$ was produced by dissolving 44.54 g of $Gd(NO_3) \cdot 5.4H_2O$, 52.27 g of $Ba(NO_3)_2$ and 72.48 g of $Cu(NO_3)_2 \cdot 3H_2O$ in 80 $cm^3$ of $H_2O$. The solution was then exposed to microwaves at 2.45 GHz and 700 W for about 80 minutes. The resulting powder was then reheated in a conventional tube furnace in an oxygen atmosphere for about 24 hours at a temperature of about 1050° C.

The resulting $GdBa_2Cu_3O_x$ powder was superconducting at a temperature as high as about 93 K. Additional oxygen may be introduced into the system if the oxygen atmosphere used to reheat the material is at higher than ambient pressures.

The foregoing description of the preferred embodiments of the invention have been presented for purposes of illustration and description. It is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What we claim is:

1. A method for making a composition of matter consisting essentially of nickel and aluminum oxide particles which are dispersed throughout the nickel comprising:
   a. dissolving nickel nitrate and aluminum nitrate in water to form a solution, in amounts effective to yield said composition of matter;
   b. exposing said solution to microwave radiation at a frequency and power effective to evaporate water for a period of time sufficient to form a powder, said powder being comprised of nickel oxide and aluminum oxide; and
   c. reheating said powder in an hydrogen-rich atmosphere for a sufficient time and at a sufficient temperature to reduce said nickel oxide to nickel and cause said powder to form a coherent mass, thus forming said composition of matter.

2. The method of claim 1, wherein said microwave radiation has a frequency of about 2.45 gigahertz.

3. The method of claim 1, wherein said microwave radiation is provided at a power of from about 700 W to about 6,000 W.

4. The method of claim 1, wherein said solution is exposed to microwave radiation for a time period of from about 1 to about 55 min.

5. The method of claim 1, wherein said powder is heated in said hydrogen-rich atmosphere to a temperature of about 600° C. for about 2 hours.

* * * * *